(12) United States Patent
Cho

(10) Patent No.: US 12,079,042 B2
(45) Date of Patent: Sep. 3, 2024

(54) FLEXIBLE DISPLAY DEVICE

(71) Applicant: SAMSUNG DISPLAY CO., LTD., Yongin-si (KR)

(72) Inventor: Sunhaeng Cho, Hwaseong-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 18/467,590

(22) Filed: Sep. 14, 2023

(65) Prior Publication Data
US 2024/0004432 A1 Jan. 4, 2024

Related U.S. Application Data

(60) Continuation of application No. 17/672,014, filed on Feb. 15, 2022, now Pat. No. 11,797,055, which is a
(Continued)

(30) Foreign Application Priority Data

Oct. 19, 2016 (KR) ........................ 10-2016-0135864

(51) Int. Cl.
G06F 1/16 (2006.01)
G09F 9/30 (2006.01)
(Continued)

(52) U.S. Cl.
CPC ............ *G06F 1/1652* (2013.01); *G09F 9/301* (2013.01); *H10K 77/111* (2023.02);
(Continued)

(58) Field of Classification Search
CPC ................. G06F 1/1652; G06F 3/0412; G06F 2203/04102; G09F 9/301; H10K 77/111;
(Continued)

(56) References Cited

U.S. PATENT DOCUMENTS 6,577,496 B1 6/2003 Gioscia et al.
8,576,031 B2 11/2013 Lauder et al.
(Continued)

FOREIGN PATENT DOCUMENTS

KR 10-2014-0090921 A 7/2014
KR 10-2015-0099383 A 8/2015
(Continued)

*Primary Examiner* — Rockshana D Chowdhury
(74) *Attorney, Agent, or Firm* — Lewis Roca Rothgerber Christie LLP

(57) ABSTRACT

A flexible display device includes a flexible display module including a flexible display panel; a first frame and a second frame supporting the flexible display module; and a fixing coupler and an aligning coupler coupling the flexible display module with the first frame and the second frame, and the fixing coupler includes: a first fixing coupler fixing at least a portion of the first frame and at least a portion of the flexible display module; and a second fixing coupler fixing at least a portion of the second frame and at least a portion of the flexible display module, and the aligning coupler includes: a first aligning coupler fixed to another portion of the flexible display module; and a second aligning coupler fixed to another portion of the first frame and detachably coupled to the first aligning coupler.

13 Claims, 12 Drawing Sheets

Related U.S. Application Data continuation of application No. 17/078,665, filed on Oct. 23, 2020, now Pat. No. 11,269,380, which is a continuation of application No. 16/411,750, filed on May 14, 2019, now Pat. No. 10,817,023, which is a division of application No. 15/786,416, filed on Oct. 17, 2017, now Pat. No. 10,331,173.

(51) Int. Cl.
*H10K 77/10* (2023.01)
*G06F 3/041* (2006.01)
*H10K 59/40* (2023.01)
*H10K 102/00* (2023.01)

(52) U.S. Cl.
CPC .. *G06F 3/0412* (2013.01); *G06F 2203/04102* (2013.01); *H10K 59/40* (2023.02); *H10K 2102/311* (2023.02)

(58) Field of Classification Search
CPC .. H10K 59/40; H10K 2102/311; H10K 59/87; H10K 59/90; Y02P 70/50; G02F 1/133305
See application file for complete search history.

(56) References Cited

U.S. PATENT DOCUMENTS

| | | | |
|---|---|---|---|
| 8,662,731 B2 | 3/2014 | Wang et al. | |
| 9,063,592 B2* | 6/2015 | Kim | G06F 1/1652 |
| 9,086,850 B2 | 7/2015 | Verschoor et al. | |
| 9,224,366 B1 | 12/2015 | Park | |
| 9,348,450 B1 | 5/2016 | Kim | |
| 9,572,272 B2 | 2/2017 | Lee | |
| 9,625,947 B2 | 4/2017 | Lee et al. | |
| 10,817,023 B2 | 10/2020 | Cho | |
| 10,834,814 B2 | 11/2020 | Cho et al. | |
| 10,838,457 B2 | 11/2020 | Yu et al. | |
| 10,905,020 B2 | 1/2021 | Jan et al. | |
| 10,928,863 B2 | 2/2021 | Pelissier et al. | |
| 11,016,530 B2 | 5/2021 | Watamura et al. | |
| 11,042,193 B2 | 6/2021 | Lin | |
| 11,194,366 B2 | 12/2021 | Cheng | |
| 2014/0355195 A1 | 12/2014 | Kee et al. | |
| 2015/0241925 A1 | 8/2015 | Seo et al. | |
| 2015/0286288 A1 | 10/2015 | Lee et al. | |
| 2015/0378397 A1 | 12/2015 | Park et al. | |
| 2016/0062408 A1* | 3/2016 | Lee | G06F 1/1641 345/173 |
| 2016/0187985 A1 | 6/2016 | Lim et al. | |
| 2016/0295709 A1 | 10/2016 | Ahn | |
| 2016/0299531 A1* | 10/2016 | Vertegaal | G06F 3/04886 |
| 2017/0083092 A1* | 3/2017 | Levesque | G06F 3/0346 |
| 2017/0220077 A1* | 8/2017 | Holung | G06F 1/1681 |
| 2018/0058120 A1* | 3/2018 | Hamel | G06F 1/1681 |

FOREIGN PATENT DOCUMENTS

| | | |
|---|---|---|
| KR | 10-2016-0032080 A | 3/2016 |
| KR | 10-2016-0049235 A | 5/2016 |
| KR | 10-2016-0083608 A | 7/2016 |

* cited by examiner

FLEXIBLE DISPLAY DEVICE

CROSS-REFERENCE TO RELATED APPLICATIONS

This application is a continuation of U.S. patent application Ser. No. 17/672,014, filed on Feb. 15, 2022, which is a continuation of U.S. patent application Ser. No. 17/078,665, filed on Oct. 23, 2020, now U.S. Pat. No. 11,269,380, which is a continuation of U.S. patent application Ser. No. 16/411, 750, filed on May 14, 2019, now U.S. Pat. No. 10,817,023, which is a divisional of U.S. patent application Ser. No. 15/786,416, filed on Oct. 17, 2017, now U.S. Pat. No. 10,331,173, which claims priority to and the benefit of Korean Patent Application No. 10-2016-0135864, filed on Oct. 19, 2016 in the Korean Intellectual Property Office, the entire contents of all of which are incorporated by reference herein.

BACKGROUND

1. Field

Aspects of embodiments of the present invention relate to a flexible display device.

2. Description of the Related Art

In recent times, information technology devices equipped with a flat panel display having excellent characteristics such as slimness, light weight, and low power consumption have been widely used, as the information society has advanced. Among these, the screens of smartphones, which are comfortable to watch broadcasts and videos and suitable for games, are becoming larger because many users prefer smartphones having a wide screen.

However, an increase of the screen size of the smartphone leads to degradation of portability, so there is a limitation in enlarging the screen of the smartphone. Accordingly, users who are not satisfied with the current screen size of the smartphone often carry a tablet computer for playing games, watching videos, reading, and so on. However, carrying both a smartphone and a tablet computer is disadvantageous for portability.

In order to improve such portability, there has been a demand for developing an electronic device such as a foldable smartphone. With the development of flexible display technology, foldable electronic devices can be currently developed. The present invention relates to a configuration of electronic devices applied with a flexible display panel, e.g., a smartphone including a foldable display unit.

It is to be understood that this background of the technology section is intended to provide useful background for understanding the technology disclosed herein, and, as such, this technology background section may include ideas, concepts or recognitions that were not part of what was known or appreciated by those skilled in the pertinent art prior to a corresponding effective filing date of subject matter disclosed herein.

SUMMARY

According to an aspect of one or more embodiments of the present invention, a flexible display device includes a flexible display panel which is fastened by a jig to be folded, and a folded portion of the flexible display panel is detachably fastened to a support frame. According to another aspect of one or more embodiments of the present invention, a flexible display device includes a foldable flexible display panel, and the flexible display device is improved in terms of flexure that occurs at a folding central portion of the flexible display device.

According to another aspect of one or more embodiment of the present invention, a flexible display device is capable of minimizing or reducing defects that may occur in a curved portion thereof due to the use over a long period of time, the flexible display device including a flexible display module including a flexible display panel, a frame supporting the flexible display module and an aligning coupler detachably coupling the frame and a curved portion of the flexible display module.

According to one or more exemplary embodiments, a flexible display device includes: a flexible display module including a flexible display panel; a first frame and a second frame supporting the flexible display module; and a fixing coupler and an aligning coupler coupling the flexible display module with the first frame and the second frame. The fixing coupler includes: a first fixing coupler fixing at least a portion of the first frame and at least a portion of the flexible display module; and a second fixing coupler fixing at least a portion of the second frame and at least a portion of the flexible display module. The aligning coupler includes: a first aligning coupler fixed to another portion of the flexible display module; and a second aligning coupler fixed to another portion of the first frame and detachably coupled to the first aligning coupler.

The aligning coupler may further include a third aligning coupler fixed to another portion of the second frame.

The second aligning coupler and the third aligning coupler may be located adjacent to each other at a boundary portion between the first frame and the second frame.

The first aligning coupler may include a panel magnetic layer fixed to the flexible display module and having magnetic properties. The second aligning coupler may include a first frame magnetic layer fixed on the first frame and having magnetic properties.

The panel magnetic layer may include a first panel magnetic element having a first surface polarity, and the first frame magnetic layer may include a first frame magnetic element having a second surface polarity different from the first surface polarity.

The panel magnetic layer may further include a second panel magnetic element being adjacent to the first panel magnetic element and having the second surface polarity, and the first frame magnetic layer may further include a second frame magnetic element being adjacent to the first frame magnetic element, having the first surface polarity and facing the second panel magnetic element.

The first panel magnetic element and the second panel magnetic element may be arranged alternately in a direction perpendicular to a boundary portion between the first frame and the second frame. The first frame magnetic element and the second frame magnetic element may be arranged alternately in the direction perpendicular to the boundary portion between the first frame and the second frame.

The first panel magnetic element and the second panel magnetic element may be arranged alternately in a direction of the boundary portion between the first frame and the second frame. The first frame magnetic element and the second frame magnetic element may be arranged alternately in the direction of the boundary portion between the first frame and the second frame.

The fixing coupler may further include: a first fixing coupler fixing another portion of the first frame and a portion of the flexible display module; and a second fixing coupler fixing another portion of the second frame and a portion of the flexible display module.

The flexible display device may further include a hinge portion pivotally coupling the first frame and the second frame.

According to one or more exemplary embodiments, a flexible display device includes: a flexible display module including a flexible display panel; a first frame and a second frame supporting the flexible display module; and a fixing coupler and an electrostatic coupler coupling the flexible display module with the first frame and the second frame. The fixing coupler includes: a first fixing coupler fixing at least a portion of the first frame and at least a portion of the flexible display module; and a second fixing coupler fixing at least a portion of the second frame and at least a portion of the flexible display module. The electrostatic coupler includes a first electrostatic coupler detachably coupling at least a portion of the first frame and at least a portion of the flexible display module.

The first electrostatic coupler may include a static electricity generator fixed on the first frame.

The flexible display device may further include a static electricity plate fixed to the flexible display module.

The flexible display device may further include a curvature sensor sensing a curvature of the flexible display module.

An electrostatic force of the static electricity generator may vary in accordance with a sensing value of the curvature sensor.

The curvature sensor may include at least one of a magnetic sensor, a pressure sensor, a proximity sensor, and an optical detection sensor.

The flexible display device may further include a hinge portion pivotally coupling the first frame and the second frame.

The foregoing is illustrative only and is not intended to be in any way limiting. In addition to the illustrative aspects, exemplary embodiments, and features described above, further aspects, exemplary embodiments, and features will become apparent by reference to the drawings and the following description.

BRIEF DESCRIPTION OF THE DRAWINGS

A more complete appreciation of the present invention will become more apparent by describing in further detail some exemplary embodiments thereof with reference to the accompanying drawings, wherein.

DETAILED DESCRIPTION

Figure 1:
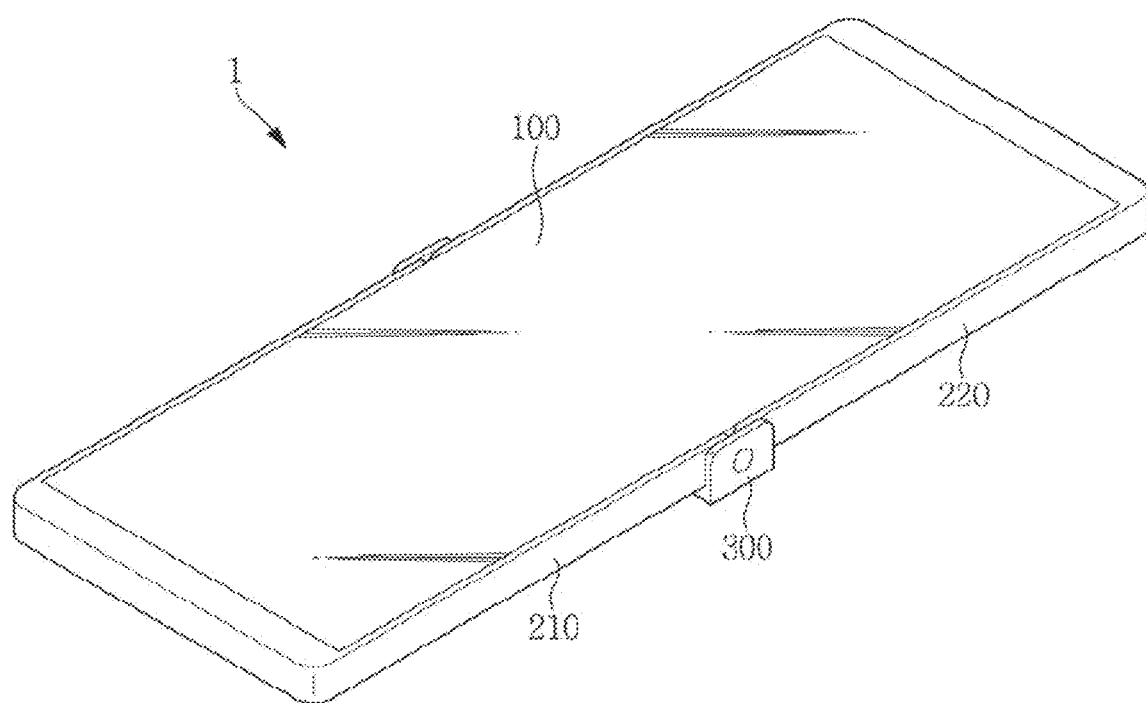
FIG. 1 is a perspective view illustrating a flexible display device.

Some exemplary embodiments will now be described more fully herein with reference to the accompanying drawings. Although the invention may be modified in various manners and may have a number of exemplary embodiments, some exemplary embodiments are illustrated in the accompanying drawings and will be mainly described in the specification. However, the scope of the invention is not limited to the exemplary embodiments described and shown herein and should be construed as including all variations, equivalents, and substitutions included in the spirit and scope of the invention.

In the drawings, thicknesses of layers and areas may be illustrated in an enlarged manner for clarity and ease of description thereof. When a layer, area, or plate is referred to as being "on" another layer, area, or plate, it may be directly on the other layer, area, or plate, or one or more intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "lower," "above," "upper," and the like, may be used herein for ease of description to describe the relations between one element or component and another element or component as illustrated in the drawings. It will be understood that the spatially relative terms are intended to encompass different orientations of the device in use or operation, in addition to the orientations depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in another direction, and, thus, the spatially relative terms may be interpreted differently depending on the orientations.

Throughout the specification, when an element is referred to as being "connected" to another element, the element may be "directly connected" to the other element or "electrically connected" to the other element with one or more intervening elements interposed therebetween. It will be further understood that the terms "comprises," "including," "includes," and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" described below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e. the limitations of the measurement system). For example, "about" may mean within one or more standard deviations, or within ±30%, 20%, 10%, or 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and are not to be interpreted in an ideal or excessively formal sense unless clearly defined in the present specification.

Some of the parts which are not associated with the description may not be provided in order to specifically describe embodiments of the present invention, and like reference numerals refer to like elements throughout the specification.

FIG. 1 is a perspective view illustrating a flexible display device.

Referring to FIG. 1, a flexible display device 1 according to an exemplary embodiment may include a flexible display module 100, a first frame 210, a second frame 220, and a hinge portion 300.

The flexible display module 100 may include a touch screen which enables an electrostatic or pressure sensitive touch input so as to receive a user's instruction or input in a touch manner.

Such a flexible display module 100 may output data, such as images, moving pictures, characters, and the like on a screen when the flexible display module 100 is unfolded at a flat angle (e.g., 180 degrees). Further, a central portion of the flexible display module 100 may be curved or folded with respect to the hinge portion 300 such that the first frame 210 and the second frame 220 face each other.

A central portion of the flexible display module 100 which is folded corresponding to the hinge portion 300 has an area which is not fixed by a mechanical frame such that a natural curved surface may be formed without being subjected to external pressure during folding actions.

Figure 2:
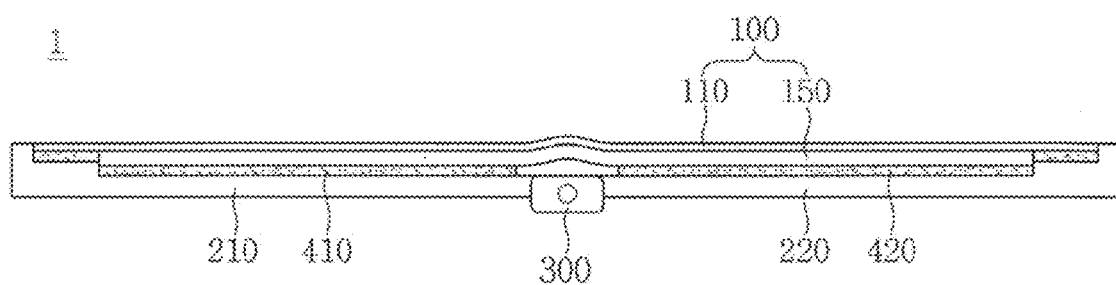
FIG. 2 is a cross-sectional view illustrating the flexible display device of FIG. 1.

FIG. 2 is a cross-sectional view illustrating the flexible display device 1 of FIG. 1.

Referring to FIG. 2, the flexible display device 1 includes a flexible display panel 110, a support module 150, a first frame 210, a second frame 220, a hinge portion 300, a first fixing coupler 410, and a second fixing coupler 420.

The flexible display panel 110 may be curved at a curvature (e.g., a predetermined curvature) according to external pressure. To this end, the flexible display panel 110 may use a plastic substrate rather than a commonly used glass substrate and may use a low-temperature manufacturing process rather than a conventional manufacturing process so as to prevent or substantially prevent damage to the substrate.

The flexible display panel 110 may be, for example, an organic light emitting diode ("OLED") display panel. The OLED display panel may have a configuration in which an organic light emitting layer (not illustrated) formed on a flexible substrate, and a protective layer (not illustrated) protecting the organic light emitting layer are disposed. The flexible display panel 110 may include pixels therein and may further include a driver (not illustrated) for driving each pixel.

The flexible display module 100 may include the flexible display panel 110 and the support module 150 attached to a back surface portion of the flexible display panel 110. The support module 150 supports the back surface portion of the flexible display panel 110 such that a screen of the flexible display panel 110 may maintain a constant plane. The structure of the support module 150 will be described below in more detail with reference to FIG. 4.

The first frame 210 and the second frame 220 may be coupled to the flexible display module 100 or the flexible display panel 110, respectively, through the first and second fixing couplers 410 and 420. The first frame 210 and the second frame 220 support the flexible display module 100, and a driver (not illustrated) for driving the flexible display panel 110 may be disposed on the first and second frames 210 and 220. Outermost portions of the first frame 210 and the second frame 220 and an outermost portion of the flexible display panel 110 may be directly coupled to each other through the first and second fixing couplers 410 and 420, respectively.

The first and second fixing couplers 410 and 420 which couple the first frame 210 and the second frame 220 with the flexible display module 100 may include a pressure sensitive adhesive (PSA). The pressure sensitive adhesive is a type of adhesives which may adhere to an adherend surface and may be firmly fixed by pressure. The pressure sensitive adhesive is excellent in viscosity and elasticity, such that the pressure applied to the flexible display panel 110 may be dispersed to prevent or substantially prevent breakage.

The hinge portion 300 is connected to each of the first frame 210 and the second frame 220 and pivotally connects the first frame 210 and the second frame 220 such that the flexible display module 100 may be unfolded into a flat surface or folded like a book. The central portion of the flexible display module 100 includes a non-adhesive area which is not coupled to or fixed to any of the first frame 210, the second frame 220, and the hinge portion 300 so as to unconstrainedly form a curved surface during folding and unfolding actions.

When the first frame 210 and the second frame 220 are fully open to a flat angle (e.g., 180 degrees) such that the flexible display module 100 becomes flat, as illustrated in FIG. 2, a flexure may occur at a central portion of the flexible display module 100. The flexure of the central portion of the display module 100 may occur because a back surface portion of a central area of the flexible display module 100 is not fixed by the frame. Accordingly, as the area that is not fixed to the first and second frames 210 and 220 increases, the flexure may become larger.

Figure 3A:
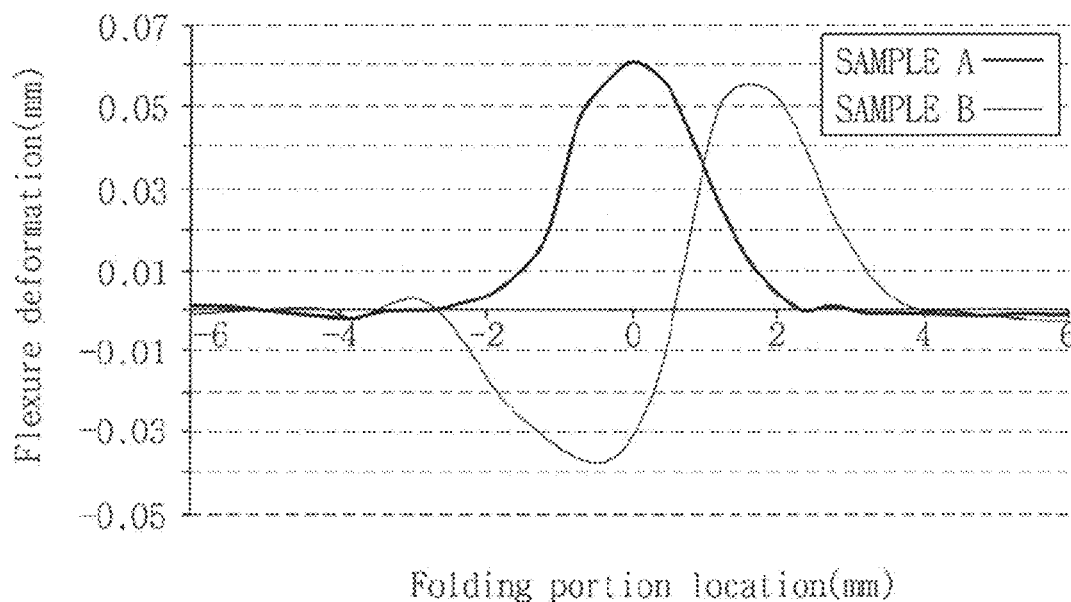
FIGS. 3A and 3B show results of a flexure test of a flexible display panel.

FIG. 3A shows results of a flexure test of the flexible display panel.

A graph of FIG. 3A shows flexural deformation that occurred when a sample A and a sample B were held in a folded state for 240 hours in a high-temperature and high-humidity environment. The samples A and B in FIG. 3A are flexible display panels 110 that include a non-adhesive portion having a length of about 8 mm at a central portion. A central point of the flexible display panel 110 is set as a reference point at 0 mm and areas on the left and right sides of the central point, each having a length of about 4 mm which is not attached to the frame, is set as a non-adhesive area. The test results show that the flexural deformation of the flexible display panel 110 occurred at a maximum of about 60 μm or more. As described above, the flexural deformation occurring at the central portion of the flexible display panel 110 may degrade the screen visibility of the central portion.

Figure 3B:
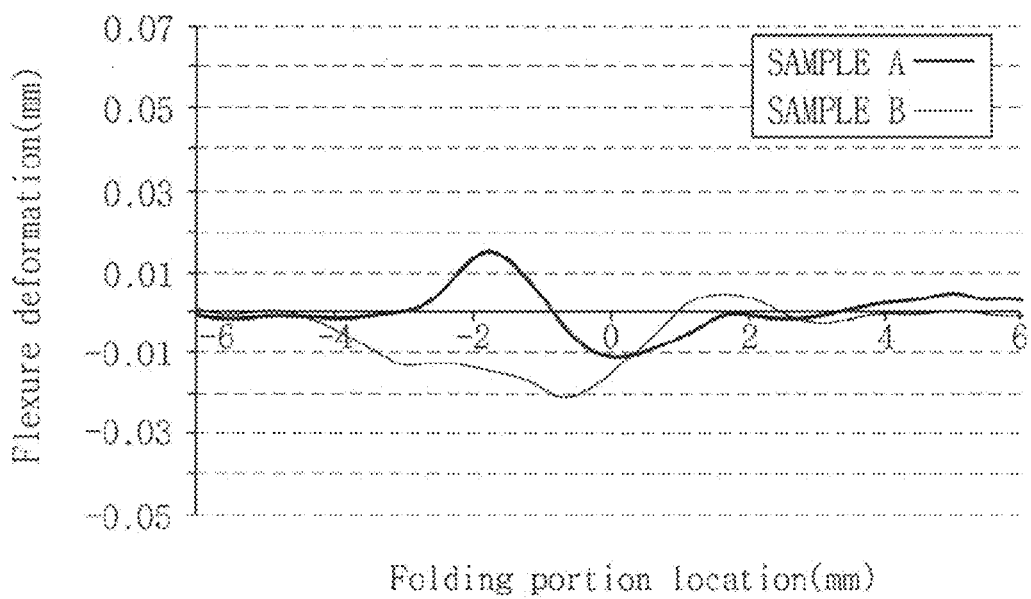

FIG. 3B shows results of a flexure test of a flexible display panel.

A graph of FIG. 3B shows test results in a case in which the samples A and B were held under substantially the same test condition as in FIG. 3A except that a length of the non-adhesive area at the central portion was reduced to about 4 mm.

Referring to FIG. 3B, in the flexible display panel 110 that has a central point set as a reference point at 0 mm and non-adhesive areas on the left and right sides of the central point, each having a width of about 2 mm, flexure occurred at a maximum of about 20 μm or more.

The test results of FIGS. 3A and 3B show that, as the non-adhesive area at the central portion of the panel is reduced from about 8 mm to about 4 mm, the flexural deformation at the central portion of the panel is improved by about 40 μm.

Figure 4:
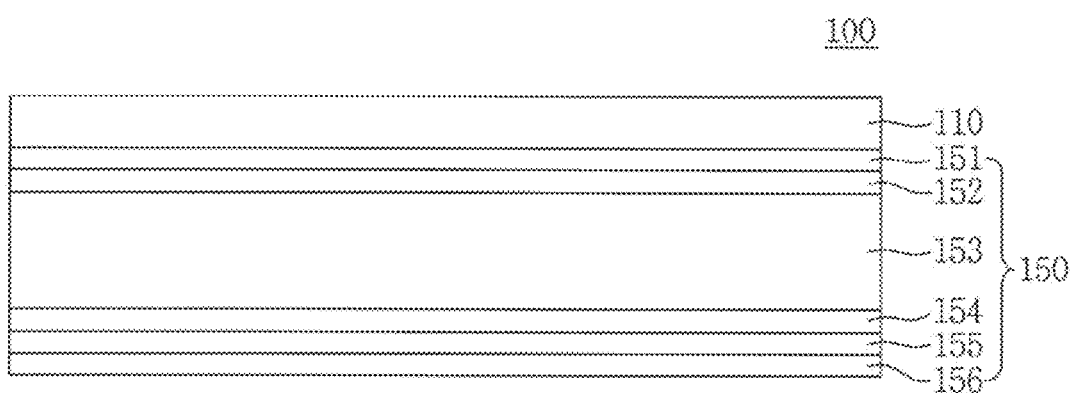
FIG. 4 is a cross-sectional view illustrating a flexible display module.

FIG. 4 is a cross-sectional view illustrating a flexible display module.

Referring to FIG. 4, the flexible display module 100 includes the flexible display panel 110 and the support module 150 on the back surface of the flexible display panel 110. The support module 150, in an embodiment, may include a light absorbing layer 151, a first adhesive layer 152, a shock buffer layer 153, a second adhesive layer 154, a heat conductive layer 155, and a conductive layer 156.

In an embodiment, the flexible display panel 110 may be an OLED display panel including a light emitting layer on a flexible substrate. The flexible display panel 110 having a multilayer structure may include a thin film transistor ("TFT") on the substrate and an OLED (not illustrated) electrically connected to the TFT.

The light absorbing layer 151, in an embodiment, includes a black light absorbing material and is disposed on the back surface of the flexible display panel 110. The light absorbing layer 151 absorbs a reflected light that has been incident to a light incidence surface of the flexible display panel 110 and reflected therefrom, thereby improving the image quality of the flexible display panel 110.

The shock buffer layer 153 absorbs a part of a welding force applied to the flexible display panel 110 to prevent or substantially prevent damage to the flexible display panel 110 and the first and second frames 210 and 220. The shock buffer layer 153 may absorb a part of a stress applied in the area where the flexible display panel 110 is folded in accordance with the deformation of the panel. In addition, the shock buffer layer 153 may allow the flexible display panel 110 to be attached to the first frame 210 and the second frame 220 without bubbling in a manufacturing process of attaching the flexible display panel 110 with the first frame 210 and the second frame 220. In an embodiment, the shock buffer layer 153 may include a non-metallic elastic material, such as rubber or polyurethane, for example.

The first adhesive layer 152 may attach the light absorbing layer 151 to the shock buffer layer 153 such that they may be fixed to each other. In an embodiment, the first adhesive layer 152 may include a pressure sensitive adhesive.

The heat conductive layer 155 may conduct a local heat generated in a light emission screen of the flexible display panel 110 in a lateral direction for the heat to be discharged. The heat conductive layer 155 may include a material having high thermal conductivity, such as any of a metal thin film, a graphite, and a metal-graphene composition. In an embodiment, the heat conductive layer 155 may have a thickness in a range from about 0.1 μm to about 10 μm. If the thickness is less than about 0.1 μm, the heat conduction efficiency may be insufficient, whereas if the thickness exceeds about 10 μm, there is a problem that the manufacturing cost increases due to excessive thickness. In an embodiment, the graphite used for the heat conductive layer 155 is excellent in lateral heat conductivity along an arrangement direction of the carbon particles such that the local heat generated in the flexible display panel 110 may be conducted in the lateral direction, thereby preventing or substantially preventing the pixels of the display panel from being damaged. In addition, the high temperature heat generation of circuit elements (not illustrated) located on the back surface of the flexible display panel 110 may not be locally transmitted to the flexible display panel 110.

The second adhesive layer 154 may attach the shock buffer layer 153 and the heat conductive layer 155 to each other.

In an embodiment, the conductive layer 156 includes a conductive thin film, such as copper (Cu). In an embodiment, the conductive layer 156 is grounded to maintain the ground potential such that the electrostatic discharge (ESD) flowing from the outside may be shielded.

Figure 5:
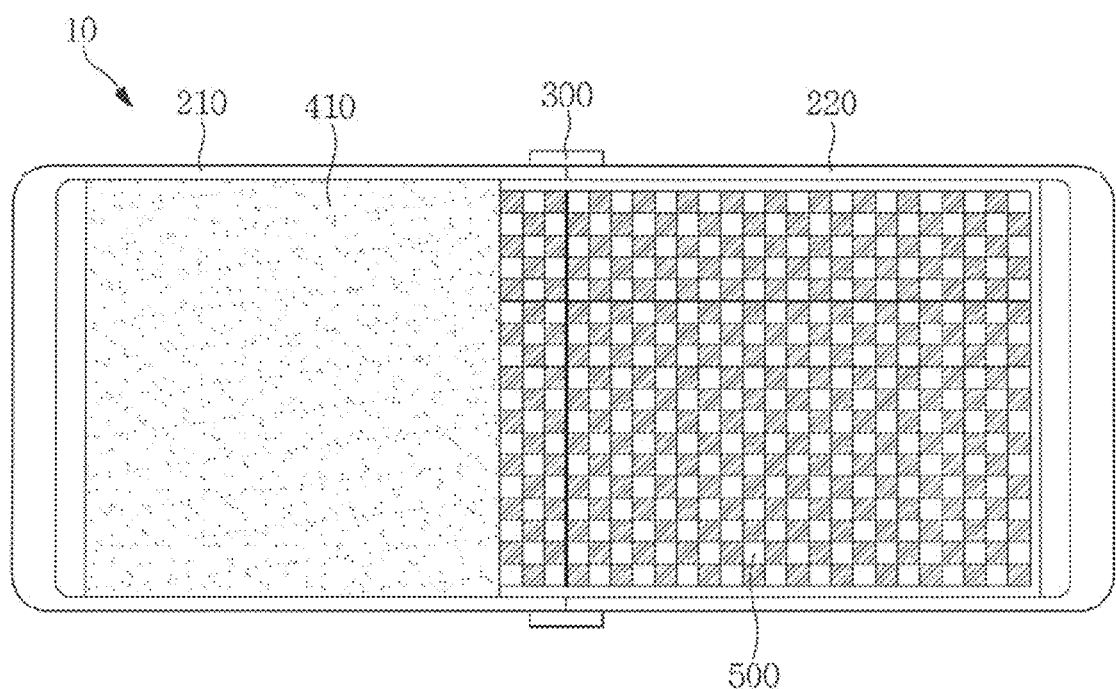
FIG. 5 is a plan view illustrating a flexible display device according to an exemplary embodiment.

FIG. 5 is a plan view illustrating a flexible display device according to an exemplary embodiment.

Figure 6:
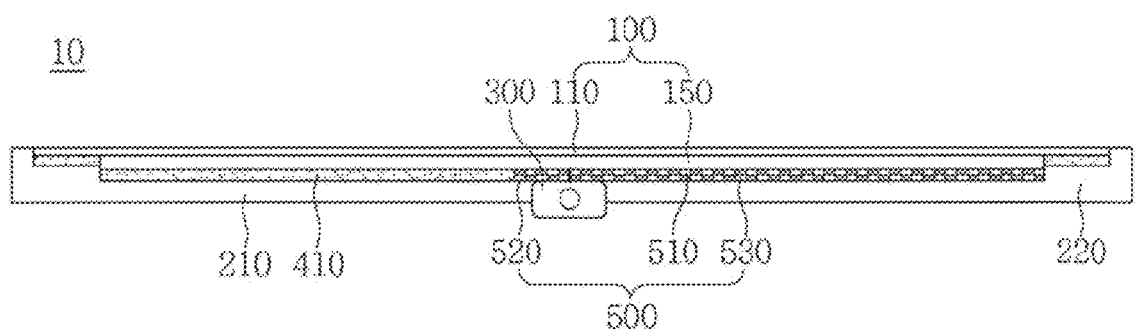
FIG. 6 is a cross-sectional view illustrating the flexible display device of FIG. 5.

FIG. 6 is a cross-sectional view illustrating the flexible display device of FIG. 5.

Referring to FIGS. 5 and 6, a flexible display device 10 includes a flexible display panel 110, a first frame 210, a second frame 220, a hinge portion 300, a support module 150, a fixing coupler 410, and an aligning coupler 500.

The first frame 210 and the second frame 220 may be pivotally coupled to each other using the hinge portion 300. The hinge portion 300 allows the flexible display panel 110 to be folded or unfolded while the first frame 210 and the second frame 220 rotate about a rotation axis. In a state in which the flexible display panel 110 is folded, a central portion of the flexible display panel 110 overlapping the hinge portion 300 becomes a hinge area.

The flexible display panel 110 may be a flexible display panel such as an OLED display panel, for example. The flexible display panel 110 may include pixels therein and may further include a driver (not illustrated) for driving each pixel.

The flexible display module 100 may include the flexible display panel 110 and the support module 150 attached to a back surface of the flexible display panel 110 to support the flexible display panel 110 to maintain a constant plane.

The first frame 210 and the second frame 220 may be coupled to the flexible display module 100 by the fixing coupler 410 and the aligning coupler 500.

The fixing coupler 410 which rigidly couples and fixes the first frame 210 and the second frame 220 with the flexible display module 100 is located mainly at an outside of the flexible display module 100, and may include an adhesive member or a mechanical coupling member that is not uncoupled by external force.

In an embodiment, the fixing coupler 410 may include a pressure sensitive adhesive (PSA). Examples of the pressure sensitive adhesive may include a natural rubber adhesive, a styrene/butadiene latex adhesive, an ABA block copolymer type thermoplastic rubber (where A is a thermoplastic polystyrene terminal block and B is an intermediate block of a polyisoprene rubber, a polybutadiene rubber, a polyethylene rubber or a polybutylene rubber), a butyl rubber, polyisobutylene, polyacrylate, an acrylic polymer adhesive such as polyacrylate or a vinyl acetate/acrylic ester copolymer, and a vinyl ether-based polymer adhesive such as polyvinyl methyl ether, polyvinyl ethyl ether or polyvinyl isobutyl ether.

On the other hand, the aligning coupler 500 detachably couples the first frame 210 and the second frame 220 with the flexible display module 100 such that the connection may be released even by a weak force.

The aligning coupler 500 includes a first aligning coupler 510 fixed to the flexible display module 100, a second aligning coupler 520 fixed to the first frame 210 and facing the first aligning coupler 510 to be detachably coupled thereto, and a third aligning coupler 530 fixed to the second frame 220 and facing the first aligning coupler 510 to be detachably coupled thereto.

The second aligning coupler 520 and the third aligning coupler 530 may oppose each other to be adjacent to each other at a boundary portion between the first frame 210 and the second frame 220. In an embodiment, the first frame 210 and the second frame 220 rotate by the hinge portion 300, and the second aligning coupler 520 and the third aligning coupler 530 may become spaced apart from each other (see FIG. 7).

The first aligning coupler 510, the second aligning coupler 520, and the third aligning coupler 530 may each include a plurality of magnetic elements. For example, the first aligning coupler 510 and the second aligning coupler 520, which face each other, may include magnetic elements having different surface polarities on facing surfaces, respectively. In addition, the third aligning coupler 530 may include, on a surface thereof facing the first aligning coupler 510, a magnetic element having a surface polarity different from that of the first aligning coupler 510. The first aligning coupler 510 and the second aligning coupler 520 may be detachably coupled to each other by an attractive force formed between the magnetic elements facing each other. Similarly, the first aligning coupler 510 and the third aligning coupler 530 may be detachably coupled to each other.

Figure 8:
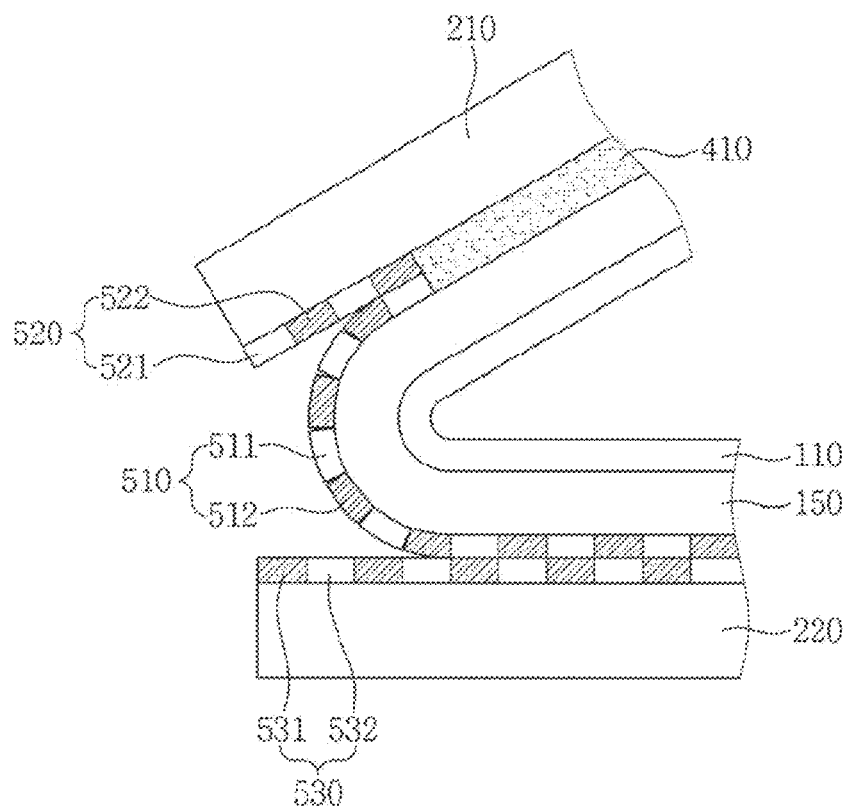
FIG. 8 is a mimetic view illustrating a folding region of FIG. 7.

Referring to FIGS. 5 and 8, the first aligning coupler 510 fixed to the flexible display module 100 may include a plurality of first panel magnetic elements 511 and a plurality of second panel magnetic elements 512 that are arranged alternately in a matrix form along a lateral direction and a longitudinal direction of the flexible display module 100. The first panel magnetic element 511 and the second panel magnetic element 512 are thin magnetic elements and may have surface polarities of "N" pole and "S" pole. The surface polarity of the magnetic element means the magnetization polarity formed on surfaces of the panel magnetic elements 511 and 512 facing frame magnetic elements.

The second aligning coupler 520 fixed to the first frame 210 may include a plurality of first frame magnetic elements 521 and a plurality of second frame magnetic elements 522 that are arranged alternately in a matrix form at the first frame 210. The first and second frame magnetic elements 521 and 522 have different surface polarities from those of respective facing ones of the first and second panel magnetic elements 511 and 512.

For example, when the first and second panel magnetic elements 511 and 512 have different surface polarities from those of the first and second frame magnetic elements 521 and 522, respectively, it means that when the surface polarity of the first panel magnetic element 511 is "N" pole, the surface polarity of the first frame magnetic element 521 corresponding to the position of the first panel magnetic element 511 has "S" pole. Accordingly, a magnetic attractive force may act between the first panel magnetic element 511 and the first frame magnetic element 521 having different surface polarities.

The third aligning coupler 530 fixed to the second frame 220 includes a plurality of third frame magnetic elements 531 and a plurality of fourth frame magnetic elements 532 that are arranged alternately in a matrix form. The third and fourth frame magnetic elements 531 and 532 have different surface polarities from those of respective facing ones of the first and second panel magnetic elements 511 and 512, respectively. In addition, the third frame magnetic element 531 and the fourth frame magnetic element 532 may have the same surface polarities as those of the first frame magnetic element 521 and the second frame magnetic element 522, respectively. For example, a magnetic attractive force may act between the first panel magnetic element 511 and the third frame magnetic element 531 having different surface polarities.

Referring back to FIG. 6, in a state in which the flexible display module 100 is flatly unfolded, the first aligning coupler 510 of the flexible display module 100 is coupled to each of the second aligning coupler 520 and the third aligning coupler 530.

The second aligning coupler 520 and the third aligning coupler 530 are located at a boundary portion between the first frame 210 and the second frame 220 and face the first aligning coupler 510 parallelly thereto. The aligning coupler 500 formed at a curved surface portion of the flexible display module 100 may fix the central portion of the flexible display module 100 to the first and second frames 210 and 220 through the coupling of the first aligning coupler 510 with the second aligning coupler 520 and the third aligning coupler 530 such that flexure may not substantially occur at the central portion of the flexible display panel 100 in the state in which the flexible display module 100 is fully unfolded.

Figure 7:
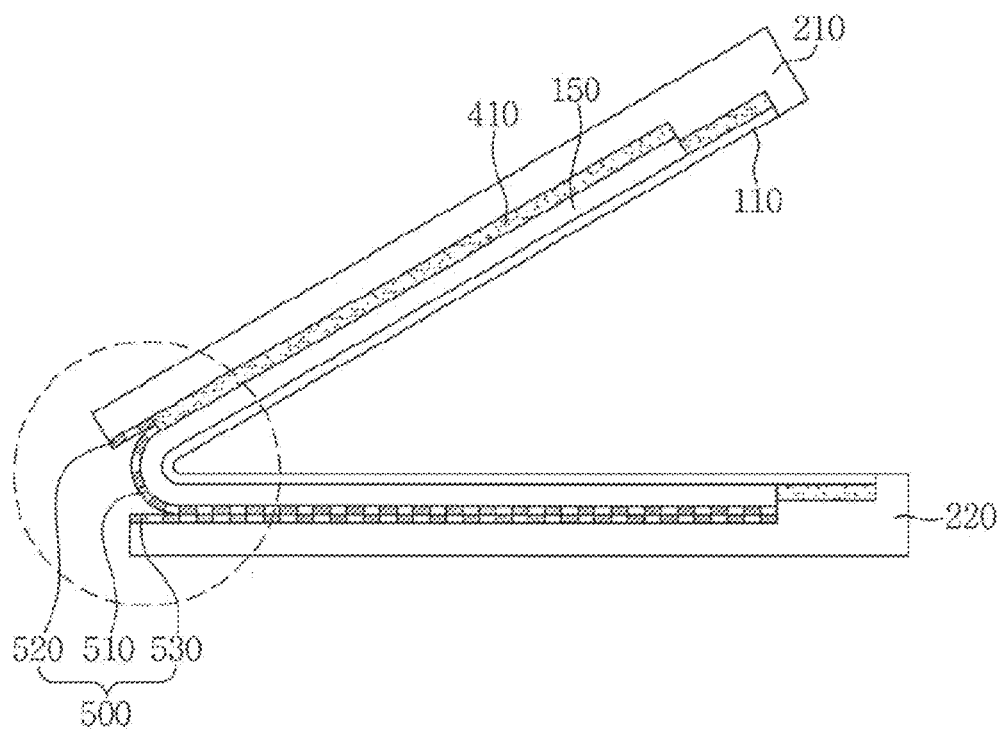
FIG. 7 is a mimetic view illustrating a folding action of the flexible display module according to an exemplary embodiment.

FIG. 7 is a mimetic view illustrating a folding action of the flexible display module according to an exemplary embodiment.

FIG. 8 is a mimetic view illustrating a folding region of FIG. 7.

Referring to FIGS. 7 and 8, when the flexible display module 100 is folded, the flexible display module 100 is deformed, having a curvature (e.g., a predetermined curvature) in the folding central area. On the other hand, although the first frame 210 and the second frame 220 are rotated by the hinge portion 300 to change a coupling angle, the frame itself includes a rigid material such as a metal or plastic and thus may not be deformed.

As illustrated in FIG. 7, when the first frame 210 is rotated by the hinge portion 300 and the flexible display module 100 has a curvature, the coupling of the first aligning coupler 510 and the second aligning coupler 520 may be partially released in a part of the coupling area. In addition, the coupling of the first aligning coupler 510 and the third aligning coupler 530 may be partially released in a part of the coupling area.

If a flexible display module were strongly coupled with first and second frames 210 and 220 in the entire area, the flexible display module may receive a strong stress at the curved portion. However, according to an exemplary embodiment, since the coupling of the flexible display module 100 with the first and second frames 210 and 220 is at least partially released at the time of curvature formation, a natural curved surface may be formed without being substantially subjected to stress.

Figure 9:
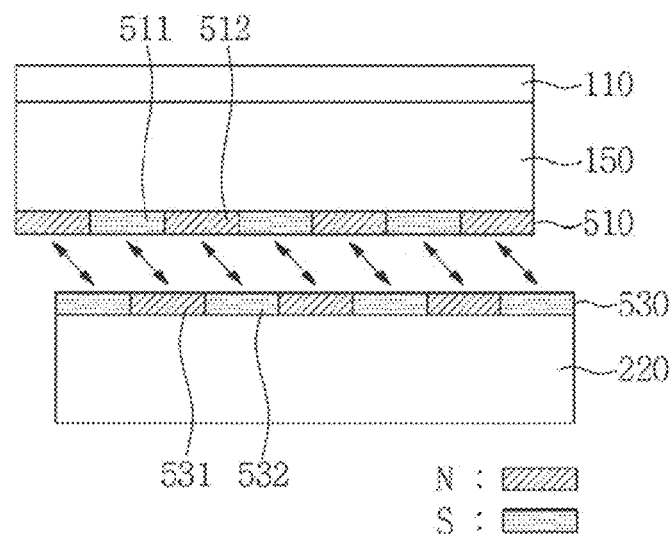
FIG. 9 is a mimetic view illustrating aligning by an aligning coupler.

FIG. 9 is a mimetic view illustrating aligning by the aligning coupler 500.

Figure 10:
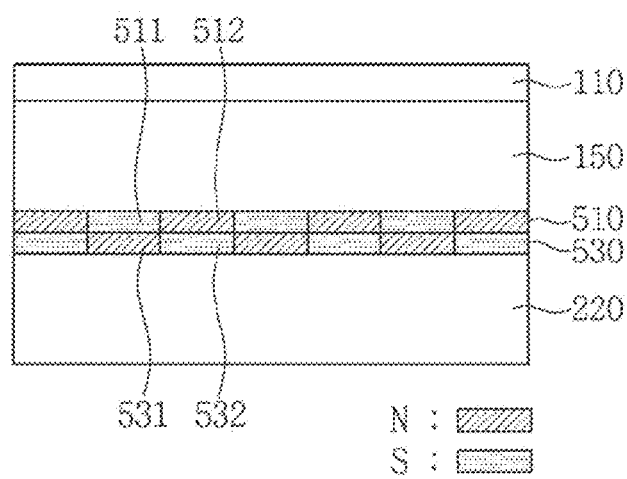
FIG. 10 is a mimetic view illustrating a state in which positions are aligned by the aligning coupler of FIG. 9.

FIG. 10 is a mimetic view illustrating a state in which positions are aligned by the aligning coupler 500.

FIG. 9 is a schematic view showing an action of the aligning coupler 500 while the flexible display module 100 is unfolded from the folded state.

In an embodiment, the first panel magnetic element 511 and the second panel magnetic element 512 at the flexible display module 100 are alternately disposed, having different surface polarities. In addition, the third frame magnetic element 531 and the fourth frame magnetic element 532 at the second frame 220 are alternately disposed, having different surface polarities.

When the flexible display module 100 is restored to the flat state from the folded state, the first aligning coupler 510 and the third aligning coupler 530, which have been spaced apart from each other, may be seated in a designated position in the proximity of each other. In the case in which a position of the flexible display module 100 deviates from the designated position, an alignment position of the first panel magnetic element 511 of the first aligning coupler 510 and an alignment position of the third frame magnetic element 531 of the third aligning coupler 530 may not correspond to each other. In such an exemplary embodiment, a magnetic attractive force is generated between the first panel magnetic element 511 and the third frame magnetic element 531. In addition, a magnetic repulsive force is generated between the third frame magnetic element 531 and the second panel magnetic element 512 due to the same surface polarity. Accordingly, in the case in which the flexible display module 100 deviates from the designated position on the second frame 220, the flexible display module 100 may be automatically aligned and seated at the designated position by the attractive forces and the repulsive forces formed between the first aligning coupler 510 and the third aligning coupler 530.

FIG. 10 shows a state in which the first panel magnetic element 511 is aligned at a position corresponding to the third frame magnetic element 531, and the flexible display module 100 is aligned at the designated position.

Although not illustrated, in an embodiment, the first panel magnetic element 511 and the second panel magnetic element 512 may be arranged in a line along a lateral direction or a longitudinal direction of the flexible display panel 110, forming a stripe shape. However, it should be understood that the arrangement of the first and second panel magnetic elements 511 and 512 and the third and fourth frame magnetic elements 531 and 532 may be varied depending on the position of the curved surface of the flexible display module 100 and the hinge structure.

Figure 11:
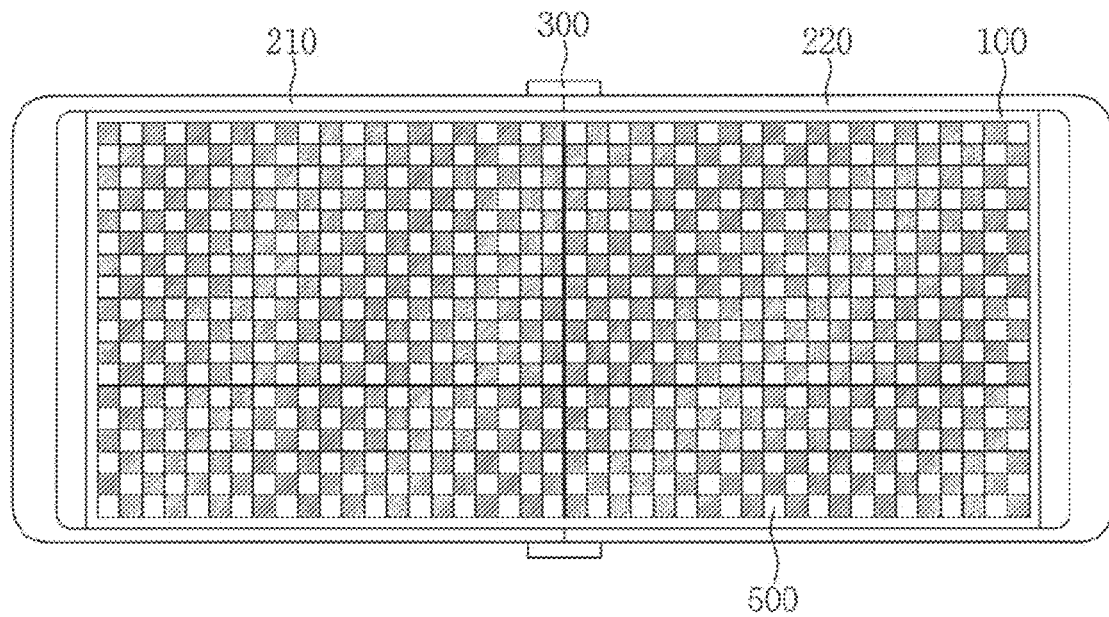
FIG. 11 is a plan view illustrating a flexible display device according to another exemplary embodiment.

FIG. 11 is a plan view illustrating a flexible display device according to another exemplary embodiment.

Figure 12:
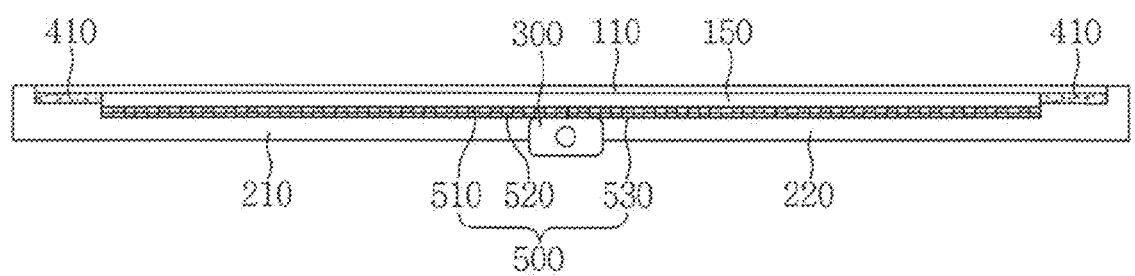
FIG. 12 is a cross-sectional view illustrating the flexible display device of FIG. 11.

FIG. 12 is a cross-sectional view illustrating the flexible display device of FIG. 11.

Referring to FIGS. 11 and 12, a flexible display module 100 is coupled to a first frame 210 and a second frame 220 at an outer edge portion thereof, using a fixing coupler 410. A support module 150 on a back surface of a flexible display panel 110 is coupled to the first frame 210 and the second frame 220 using an aligning coupler 500.

The aligning coupler 500 includes a first aligning coupler 510 fixed to the flexible display module 100, a second aligning coupler 520 at the first frame 210, and a third aligning coupler 530 at the second frame 220. The first aligning coupler 510 may include a first panel magnetic element 511 and a second panel magnetic element 512 which are alternately disposed in a matrix form in a lateral direction and a longitudinal direction of the flexible display panel 110.

The second aligning coupler 520 includes a frame magnetic element having a surface polarity different from that of the corresponding panel magnetic element at the first aligning coupler 510. In addition, the third aligning coupler 530 includes a frame magnetic element having a surface polarity different from that of the corresponding panel magnetic element at the first aligning coupler 510.

In another embodiment, although not illustrated, the first panel magnetic element 511 and the second panel magnetic element 512 may be arranged in a line along the lateral direction or the longitudinal direction of the flexible display panel 110, forming a stripe shape. However, it should be understood that the arrangement of the panel magnetic element may be varied depending on the disposition and design of a curved surface of the flexible display panel 110. In addition, a part of the frame magnetic element or a part of the panel magnetic element, on a plane, does not necessarily have to be a magnetic element. As long as the magnetic element is disposed in a facing area, the magnetic element in some areas may be replaced with a flat member including a metal material.

Figure 13:
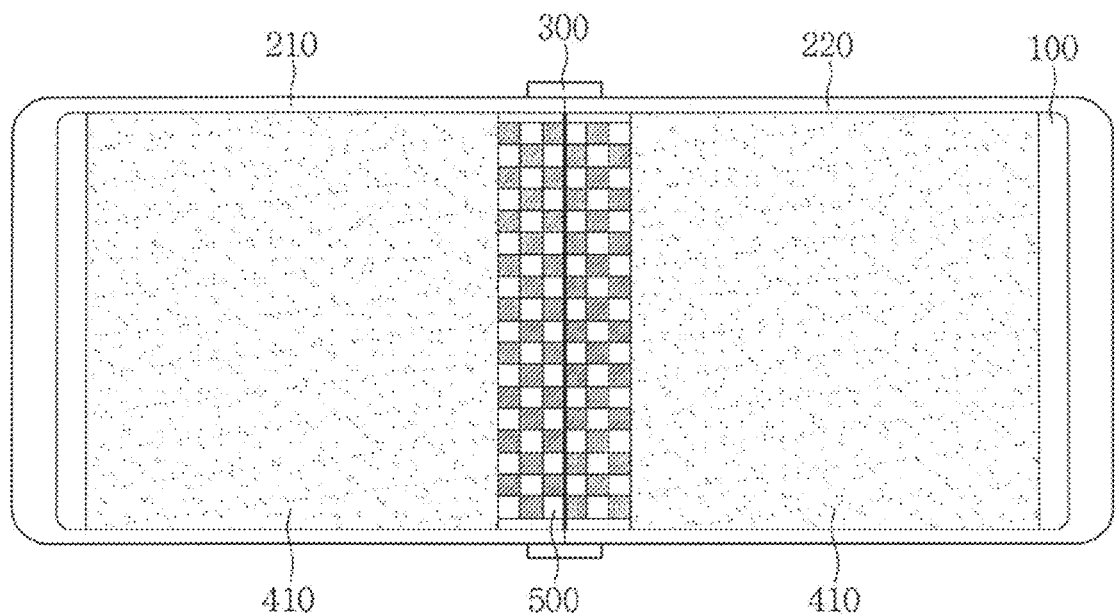
FIG. 13 is a plan view illustrating a flexible display device according to another exemplary embodiment.

FIG. 13 is a plan view illustrating a flexible display device according to another exemplary embodiment.

Figure 14:
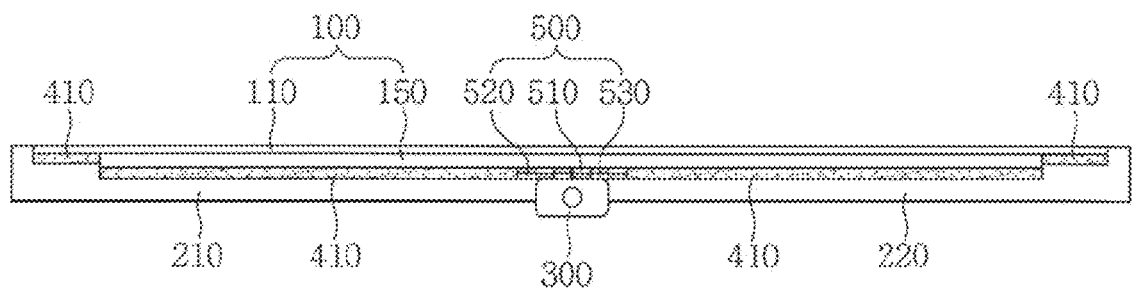
FIG. 14 is a cross-sectional view illustrating the flexible display device of FIG. 13.

FIG. 14 is a cross-sectional view illustrating the flexible display device of FIG. 13.

Referring to FIGS. 13 and 14, a portion of a flexible display module 100, except a central curved portion of the flexible display module 100, is fixed to a first frame 210 and a second frame 220 using a fixing coupler 410. The curved portion of the flexible display module 100 is coupled to the first frame 210 and the second frame 220 using an aligning coupler 500.

The aligning coupler 500 includes a first aligning coupler 510 attached to the flexible display module 100, a second aligning coupler 520 at the first frame 210, and a third aligning coupler 530 at the second frame 220.

Figure 15:
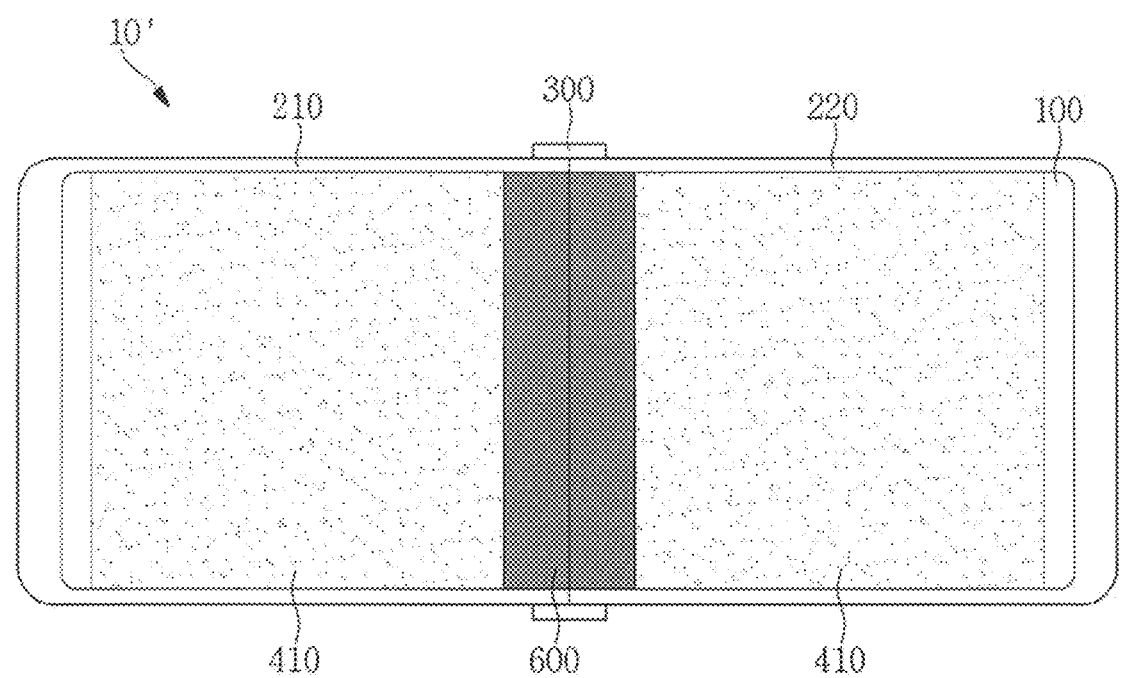
FIG. 15 is a plan view illustrating a flexible display device according to another exemplary embodiment.

FIG. 15 is a plan view illustrating a flexible display device 10' according to another exemplary embodiment.

Figure 16:
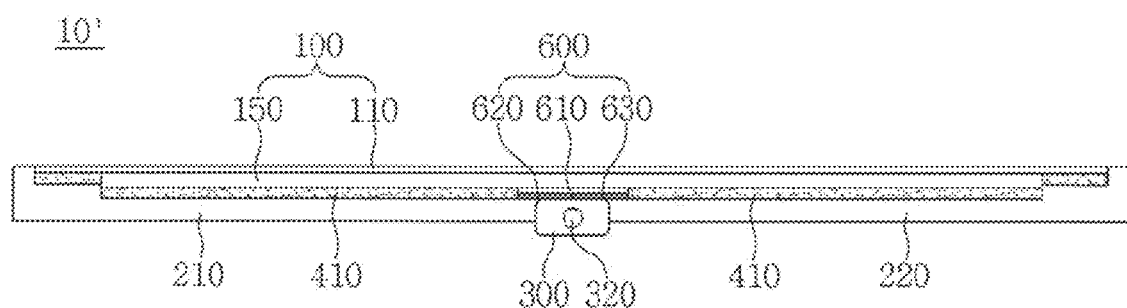
FIG. 16 is a cross-sectional view illustrating the flexible display device of FIG. 15.

FIG. 16 is a cross-sectional view illustrating the flexible display device 10' of FIG. 15.

Referring to FIGS. 15 and 16, a portion of a flexible display module 100, except a central curved portion of the flexible display module 100, is fixed to a first frame 210 and a second frame 220 using a fixing coupler 410. The curved portion of the flexible display module 100 is coupled to the first frame 210 and the second frame 220 using an electrostatic coupler 600.

The electrostatic coupler 600 may include a first static electricity generator 620 at the first frame 210, a second static electricity generator 630 at the second frame 220, and a static electricity plate 610 attached to the flexible display module 100.

The first and second static electricity generators 620 and 630 are devices for fixing a flat member using an electrostatic force. The first and second static electricity generators 620 and 630 on the first and second frames 210 and 220 generate electric charges on a surface thereof and may fix the flexible display module 100 using an attractive force generated between charged particles on the static electricity plate 610 and charged particles on the first and second static electricity generators 620 and 630.

In an embodiment, the static electricity plate 610 may include a material having high dielectric constant such that dielectric polarization may be easily generated by electrostatic force at the first and second static electricity generators 620 and 630. Some examples of commonly used high dielectric constant materials may include silicon (Si), gallium arsenide (GaAs), Teflon, polystyrene, ceramics, and the like.

The first static electricity generator 620 and the second static electricity generator 630 may be separately disposed on the first frame 210 and the second frame 220, respectively. Alternatively, only one static electricity generator may be disposed at one of the first frame 210 and the second frame 220.

The structure, the number, and the disposition of the static electricity generators may be variously modified according to the shapes of the first and second frames 210 and 220 and the structure of the hinge portion 300.

In an embodiment, since the first and second static electricity generators 620 and 630 are operated by electric power, the flexible display device 10' may include a curvature sensor 320 embedded in the hinge portion 300 such that electrostatic force of the first and second static electricity generators 620 and 630 may be controlled or blocked.

Figure 17:
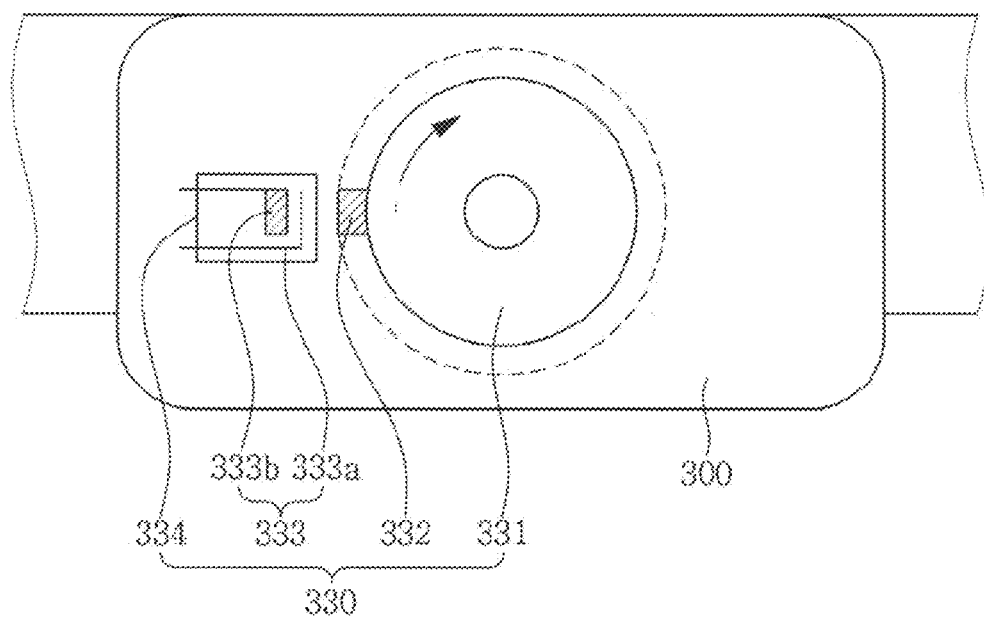
FIG. 17 is a perspective view illustrating a curvature sensor according to an exemplary embodiment.

FIG. 17 is a perspective view illustrating a curvature sensor according to an exemplary embodiment.

In an embodiment, the curvature sensor 320 may be embedded in the hinge portion 300 and may sense the folded state of the flexible display module 100 by measuring a displacement of the hinge portion 300. The curvature sensor 320 may include any of various sensors, such as a magnetic sensor, a pressure sensor, a proximity sensor, and an optical detection sensor, for example.

FIG. 17 shows an embodiment of a magnetic sensor 330 applied to the curvature sensor 320. In an embodiment, a magnetic sensor 330 includes a wheel portion 331 connected to a rotation axis of the hinge portion 300 and rotating in accordance with folding and unfolding of the flexible display module 100, a projection 332 including a permanent magnet located outside the wheel portion 331, a second contact point 333b located to face the projection 332 and displacing in terms of position according to a magnetic force of the projection 332, a sensor switch 333 including a first contact point 333a corresponding to the second contact point 333b, and a housing 334 protecting the sensor switch 333 and fixing a terminal drawn out from the sensor switch 333.

In an embodiment, the projection 332 is located on the wheel portion 331 so as to face the sensor switch 333 in a state in which the flexible display module 100 is fully unfolded. The first contact point 333a and the second contact point 333b in the sensor switch 333 do not contact each other in a state in which the flexible display module 100 is folded. However, in the state in which the flexible display module 100 is fully unfolded, the second contact point 333b moves in accordance with the magnetic force of the projection 332 and is electrically connected to the first contact point 333a by contacting the first contact point 333a.

The first and second static electricity generators 620 and 630 may detect a short state of the sensor switch 333 to selectively fix the flexible display panel 110 on the first and second frames 210 and 220 by controlling static electricity. In addition, when the sensor switch 333 is open, the operation of the first and second static electricity generators 620 and 630 may be interrupted to separate the flexible display panel 110 from the first and second frames 210 and 220.

However, it should be understood that the magnetic sensor 330 illustrated in FIG. 17 is merely provided as one example of the curvature sensor 320, and, in other embodiments, the folding of the flexible display module 100 may be detected through any of various switch configurations.

Figure 18:
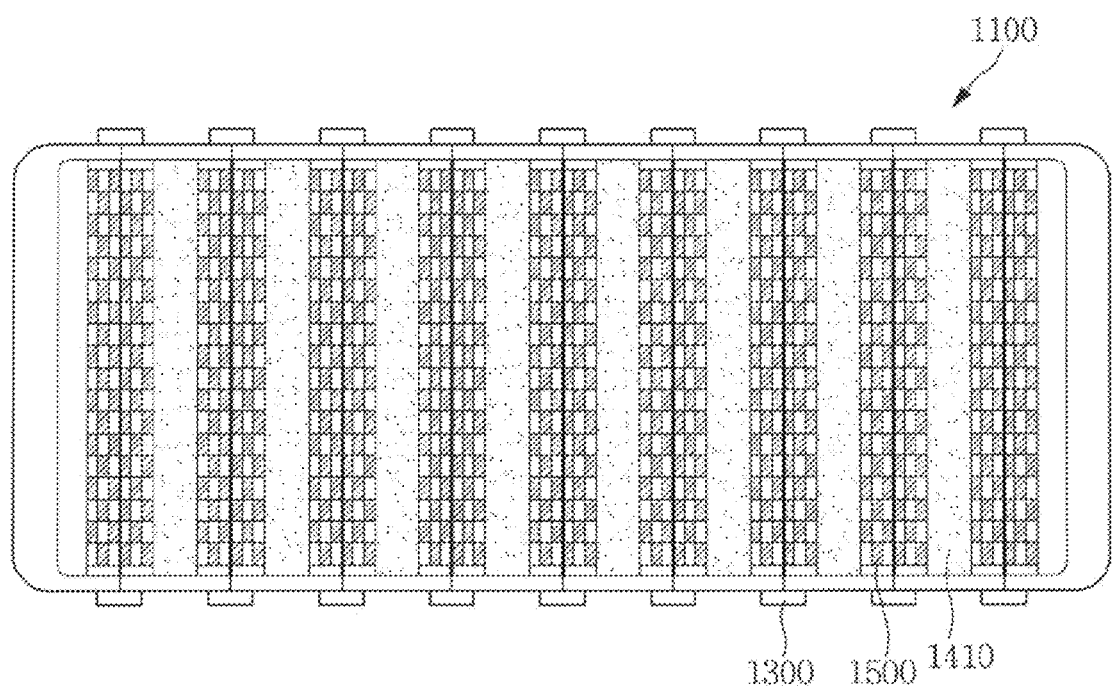
FIG. 18 is a plan view illustrating a rollable display device according to another exemplary embodiment.

FIG. 18 is a plan view illustrating a rollable display device 1100 according to another exemplary embodiment.

Figure 19:
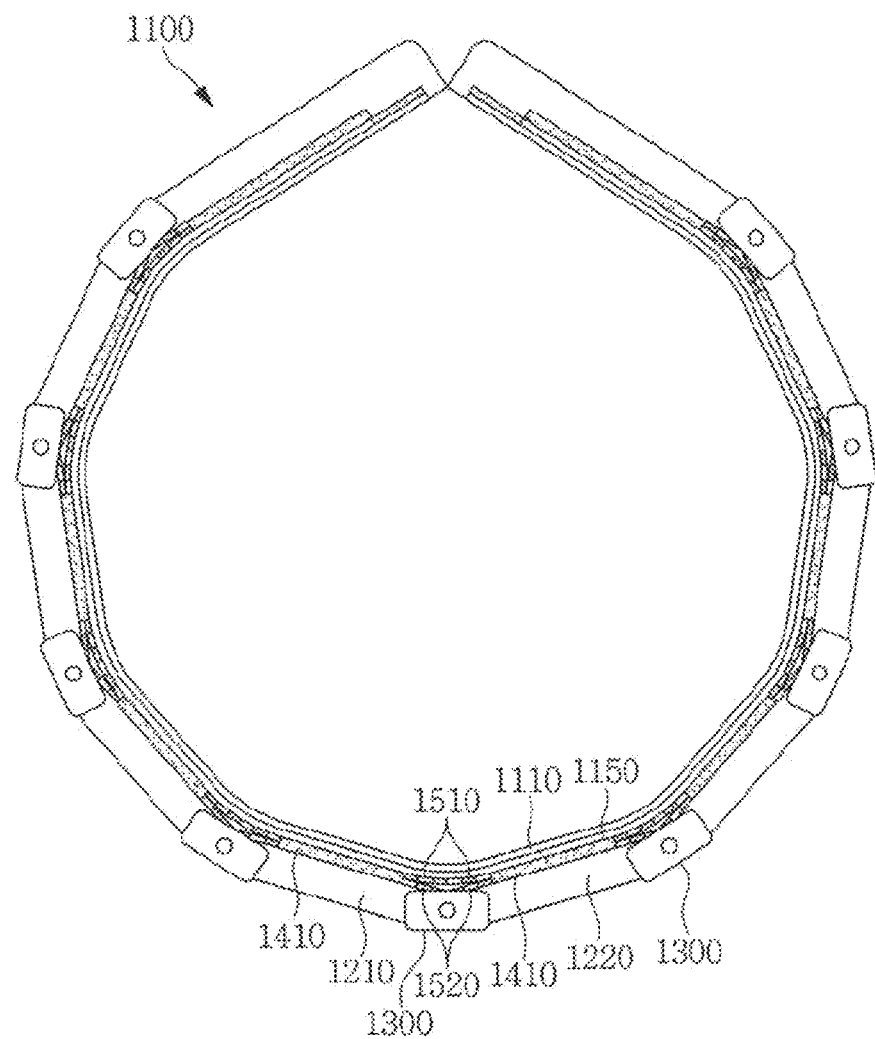
FIG. 19 is a cross-sectional view illustrating the rollable display device of FIG. 18.

FIG. 19 is a cross-sectional view illustrating the rollable display device 1100 of FIG. 18.

Referring to FIGS. 18 and 19, the rollable display device 1100 includes a plurality of frames including frames 1210 and 1220, a plurality of hinge portions 1300 connecting the plurality of frames, a support module 1150 on the plurality of frames 1210 and 1220, a fixing coupler 1410 coupling the support module 1150 and each of the plurality of frames, and an aligning coupler 1500. A rollable display panel 1110 is disposed at the support module 1150.

In an embodiment, the aligning coupler 1500 includes a first aligning coupler 1510 coupled to the support module 1150, and a second aligning coupler 1520 fixed to the frames 1210 and 1220, and the first aligning coupler 1510 and the second aligning coupler 1520 include magnetic elements facing each other and having different polarities, respectively.

In a state in which the rollable display device 1100 is fully spread, the first aligning coupler 1510 and the second aligning coupler 1520 may be coupled to each other by a magnetic force. In addition, in a state in which the rollable display device 1100 is rolled, as illustrated in FIG. 19, the first aligning coupler 1510 and the second aligning coupler 1520 are spaced apart from each other such that the rollable display panel 1110 may have a gentle curvature.

However, the rollable display device 1100 illustrated in FIGS. 18 and 19 is merely provided as one example of a flexible display device applied with the aligning coupler according to an exemplary embodiment, and the present invention may be applied to various flexible display devices other than the structure illustrated in an exemplary embodiment.

As set forth herein, according to one or more exemplary embodiments, the flexible display device may couple the lower portion of the substrate with the frame when the flexible display panel maintains the flat state, thereby improving the flexure phenomenon occurring at the folding central portion.

While the present invention has been illustrated and described with reference to some exemplary embodiments thereof, it will be apparent to those of ordinary skill in the art that various changes in form and detail may be made thereto without departing from the spirit and scope of the present invention.

What is claimed is:

1. A flexible display device comprising:
a flexible display module comprising a flexible display panel;
a first frame and a second frame supporting the flexible display module;
a hinge portion pivotally coupling the first frame and the second frame; and
a curvature sensor sensing a curvature of the flexible display module, and
the curvature sensor comprising:
a wheel portion connected to a rotation axis of the hinge portion and rotating in accordance with folding and unfolding of the flexible display module;
a sensor switch adjacent to the wheel portion; and
a permanent magnet located on the wheel portion, a distance between the sensor switch and the permanent magnet varying in accordance with rotating of the hinge portion, and
a state of the sensor switch varies the distance between the sensor switch and the permanent magnet.

2. The flexible display device as claimed in claim 1, wherein the sensor switch comprises a projection including the permanent magnet and located on a periphery of the wheel portion.

3. The flexible display device as claimed in claim 2, wherein the projection is located on the periphery of the wheel portion to face the sensor switch in a state in which the flexible display module is unfolded.

4. The flexible display device as claimed in claim 1, wherein the sensor switch comprises a first contact point and a second contact point, and
the first contact point and the second contact point corresponding to the first contact point contact or do not contact each other in accordance with the distance between the sensor switch and the permanent magnet.

5. The flexible display device as claimed in claim 4, wherein the first contact point and the second contact point do not contact each other in a state in which the flexible display module is folded.

6. The flexible display device as claimed in claim 5, wherein the first contact point and the second contact point contact each other in a state in which the flexible display module is unfolded.

7. The flexible display device as claimed in claim 4, wherein the second contact point displaces in terms of position according to a magnetic force of the permanent magnet.

8. The flexible display device as claimed in claim 7, wherein the second contact point moves in accordance with the magnetic force of the permanent magnet and is electrically connected to the first contact point by contacting the first contact point in a state in which the flexible display module is unfolded.

9. The flexible display device as claimed in claim 1, wherein the sensor switch comprises a housing protecting the first contact point and the second contact point.

10. The flexible display device as claimed in claim 9, wherein the housing fixes terminals drawn out from the first contact point and the second contact point.

11. The flexible display device as claimed in claim 1, further comprising:
an electrostatic coupler detachably coupling at least a portion of the first frame and at least a portion of the flexible display module, and
the electrostatic coupler comprises a static electricity generator, and
an electrostatic force of the static electricity generator varies in accordance with a sensing value of the curvature sensor.

12. The flexible display device as claimed in claim 11, wherein the static electricity generator is fixed on one of the flexible display module and the first frame.

13. The flexible display device as claimed in claim 12, further comprising a static electricity plate fixed to the other one of the flexible display module and the first frame.

* * * * *